(12) United States Patent
Wang et al.

(10) Patent No.: US 12,250,860 B2
(45) Date of Patent: Mar. 11, 2025

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yunhao Wang, Beijing (CN); Jie Li, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 212 days.

(21) Appl. No.: 17/630,334

(22) PCT Filed: Apr. 13, 2021

(86) PCT No.: PCT/CN2021/086959
§ 371 (c)(1),
(2) Date: Jan. 26, 2022

(87) PCT Pub. No.: WO2021/218629
PCT Pub. Date: Nov. 4, 2021

(65) Prior Publication Data
US 2023/0059728 A1    Feb. 23, 2023

(30) Foreign Application Priority Data
Apr. 27, 2020   (CN) .......................... 202010344719.2

(51) Int. Cl.
*H10K 59/38* (2023.01)
*G06F 3/044* (2006.01)
(Continued)

(52) U.S. Cl.
CPC ............. *H10K 59/38* (2023.02); *G06F 3/044* (2013.01); *H10K 50/865* (2023.02); *H10K 59/40* (2023.02); *G06F 2203/04111* (2013.01)

(58) Field of Classification Search
None
See application file for complete search history.

(56) References Cited

U.S. PATENT DOCUMENTS

| 11,009,741 B2 | 5/2021 | Li et al. |
| 2011/0062476 A1 | 3/2011 | Tobise |

(Continued)

FOREIGN PATENT DOCUMENTS

| CN | 102289016 A | 12/2011 |
| CN | 103777399 A | 5/2014 |

(Continued)

OTHER PUBLICATIONS

Machine translation of WO-2021035920-A1, for CN-110610956-A (Li) (Year: 2021).*

(Continued)

*Primary Examiner* — Yara B Green
*Assistant Examiner* — Tessa Elizabeth McNamee
(74) *Attorney, Agent, or Firm* — IPro, PLLC

(57) ABSTRACT

Provided in the present disclosure are a display substrate and a display apparatus. The display substrate comprises: a driving backplane; a light-emitting structure that is located on the driving backplane and that comprises a plurality of light-emitting devices; and a light-filtering structure located on the side of the light-emitting structure facing away from the driving backplane. The light-filtering structure comprises a plurality of light-filtering layers that correspond to at least a portion of the light-emitting devices, the light-emitting layers are provided with hollow spherical structures, and the light-filtering layers are hollow fan-shaped (Continued)

shapes in a cross section perpendicular to the driving backplane. The thicknesses of the light-filtering layers along the sphere center divergence direction of the hollow spherical structures are uniform. The problem of color cast caused by some light-filtering layers can be solved by means of designing the light-filtering layers into hollow spherical structures.

9 Claims, 4 Drawing Sheets

(51) Int. Cl.
*H10K 50/86* (2023.01)
*H10K 59/40* (2023.01)

(56) References Cited

U.S. PATENT DOCUMENTS

2018/0261785 A1* 9/2018 Ahmed ................ H10K 59/35
2020/0312915 A1 10/2020 Sun

FOREIGN PATENT DOCUMENTS

| CN | 108227291 A | | 6/2018 | |
|---|---|---|---|---|
| CN | 109979982 A | | 7/2019 | |
| CN | 110233171 A | | 9/2019 | |
| CN | 110262682 A | * | 9/2019 | ........... G06F 3/0412 |
| CN | 110310974 A | | 10/2019 | |
| CN | 110610956 A | * | 12/2019 | ....... G02F 1/133512 |
| CN | 110941363 A | | 3/2020 | |
| CN | 111554710 A | | 8/2020 | |
| JP | 2011059621 A | | 3/2011 | |

OTHER PUBLICATIONS

Machine translation of CN-110262682-A (Year: 2019).*
CN202010344719.2 first office action.

* cited by examiner

--Related Art--

DISPLAY SUBSTRATE AND DISPLAY APPARATUS

CROSS-REFERENCE TO RELATED APPLICATIONS

The present disclosure is a national phase entry under 35 U.S.C. § 371 of International Application No. PCT/CN2021/086959, filed on Apr. 13, 2021, which claims priority of Chinese Patent Application No. 202010344719.2, filed with the China National Intellectual Property Administration (CNIPA) on Apr. 27, 2020 and entitled "Display Substrate and Display Apparatus", the entire content of which is incorporated herein by reference.

FIELD

The present disclosure generally relates to the technical field of display, in particular to a display substrate and a display apparatus.

BACKGROUND

OLED display has the characteristics of being light and thin, long in service life and the like and has become a display type commonly used by people. A display substrate mainly includes a driving backplane, a light-emitting device arranged on the driving backplane, an encapsulation layer for encapsulating the light-emitting device and the like. A light-filtering structure may be arranged on the encapsulation layer and configured to convert light emitted by the light-emitting device into monochromatic light such as red, green and blue, so as to achieve color display. Further, the light-filtering structure may play a role in preventing a surface of the display substrate from reflecting ambient light. Therefore, goodness of the light-filtering structure will directly affect a display effect, for example, a color cast problem and the like caused by the light-filtering structure. Therefore, improving design of the light-filtering structure is a technical problem urgently to be solved.

SUMMARY

At a first aspect, embodiments of the present disclosure provide a display substrate, including:
a driving backplane;
a light-emitting structure, on the driving backplane, and including a plurality of light-emitting devices; and
a light-filtering structure, on a side of the light-emitting structure facing away from the driving backplane.

The light-filtering structure includes a plurality of light-filtering layers corresponding to at least part of the light-emitting devices. The light-filtering layers have hollow segment structures. Sections, perpendicular to the driving backplane, of the light-filtering layers are hollow sectorial shapes. Thicknesses of the light-filtering layer in a direction diverging along a sphere center of the hollow segment structure are uniform.

In some embodiments, orthographic projections of the light-filtering layers on the driving backplane completely cover the corresponding light-emitting devices. The light-emitting devices are on sphere center positions of the hollow segment structures of the light-filtering layers. In some embodiments, the light-filtering structure further includes: an insulating layer on sides of the light-filtering layers facing the light-emitting structure.

A surface, in contact with the light-filtering layers, of the insulating layer includes a plurality of first depressions and a plurality of first protrusions in the first depressions.

The light-filtering layers are in the first depressions.

In some embodiments, a height of the first protrusion is smaller than a depth of the first depression.

In some embodiments, tops of sides of the light-filtering layers away from the driving backplane protrude out of a surface of a side of the insulating layer facing away from the driving backplane.

In some embodiments, the light-filtering structure further includes: a planarization layer on sides of the light-filtering layers facing away from the insulting layer. A surface, in contact with the light-filtering layers, of the planarization layer is provided with depressions arranged corresponding to the light-filtering layers.

In some embodiments, the light-filtering structure further includes: light-shading layers. Orthographic projections of the light-shading layers on the driving backplane cover regions among the light-filtering layers.

In some embodiments, the display substrate further includes:
a touch control structure, on a side of the light-emitting structure facing away from the driving backplane.

The touch control structure includes touch control electrodes and bridge electrodes. The touch control electrodes are between the insulating layer and the planarization layer. The bridge electrodes are between the insulating layer and the light-emitting structure. The bridge electrodes are electrically connected with the touch control electrodes through via holes penetrating through the insulating layer.

In some embodiments, orthographic projections of the touch control electrodes and the bridge electrodes on the driving backplane do not overlap with the light-filtering layers, and fall within orthographic projections of the light-shading layers on the driving backplane.

In some embodiments, a surface of a side of the planarization layer facing away from the light-filtering layers includes a plurality of second depressions. The light-shading layers are in the second depressions. Surfaces of the light-shading layers facing away from the light-filtering layers are flush with a surface of a side of the planarization layer facing away from the light-filtering layers.

At a second aspect, embodiments of the present disclosure provide a display apparatus, including the above display substrate provided by embodiments of the present disclosure.

DETAILED DESCRIPTION OF THE EMBODIMENTS

The present disclosure will be illustrated below in detail with reference to drawings and embodiments. It should be understood that the embodiments described herein are only for explaining the related invention, rather than limiting the invention. In addition, it should be noted that for facilitating description, the drawings only show the part relevant to the invention.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "include" or "comprise" and the like means that an element or item preceding the word comprises an element or item listed after the word and the equivalent thereof, without excluding other elements or items. The word "connect" or "couple" and the like is not restricted to physical or mechanical connection, but may include electrical connection, whether direct or indirect. The words "up", "down", "left", "right" and the like are only configured to indicate the relative positional relationship. When the absolute position of the described object changes, the relative positional relationship may also change accordingly.

It should be noted that the embodiments in the present disclosure and features in the embodiments may be mutually combined in the case of no conflict. The present disclosure will be illustrated below in detail with reference to the drawings and in combination with the embodiments.

Figure 1:
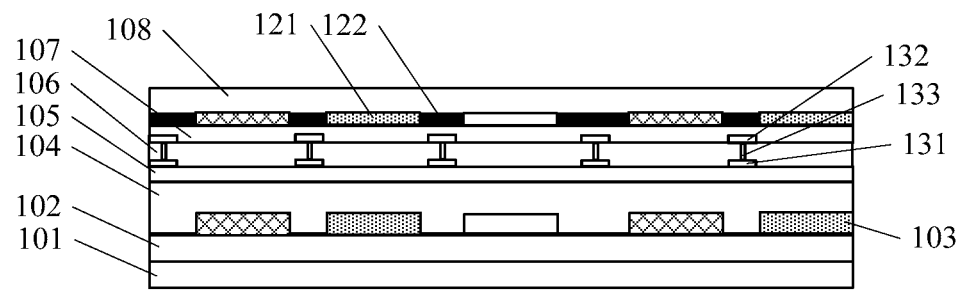
FIG. 1 illustrates an exemplary schematic structural diagram of a display substrate in the related art.

Please refer to FIG. 1, which illustrates a schematic structural diagram of a display substrate in the related art. The display substrate includes a substrate 101, a driving circuit 102, a light-emitting device(s) 103, an encapsulation layer 104, a buffer layer 105, a passivation layer 106 and a light-filtering structure. The light-filtering structure includes an insulating layer 107, a light-filtering layer(s) 121 and a planarization layer 108. The light-filtering layer 121 adopts a flat plate structure. In this way, a light path of light emitted by the light-emitting device 103 in the light-filtering layer 121 is different in length, that is, the light path gradually gets longer from the center of the light-filtering layer 121 to two sides, and the structure is prone to causing color cast. In addition, in order to achieve a touch control function, a touch control structure is additionally arranged between the encapsulation layer 104 and the light-filtering structure. The touch control structure includes a bridge electrode(s) 131 and a touch control electrode(s) 132, which are electrically connected through a via hole 133 in the passivation layer 106. A structure illustrated in FIG. 1 not only increases a thickness of the display substrate, but also improves a process complexity.

In order to obtain a thin display substrate with a good display quality, the present disclosure proposes the following technical solutions.

Figure 2:
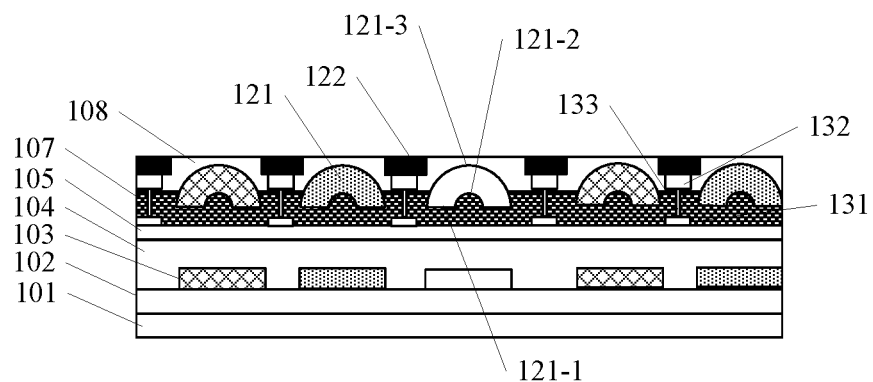
FIG. 2 illustrates an exemplary schematic structural diagram of a display substrate provided by an embodiment of the present disclosure.

Please refer to FIG. 2, a display substrate provided by embodiments of the present disclosure includes: a substrate 101, a driving circuit 102, a light-emitting device(s) 103, an encapsulation layer 104, a buffer layer 105 and a light-filtering structure. The light-filtering structure includes an insulating layer 107, a light-filtering layer(s) 121 and a planarization layer 108. The substrate 101 and the driving circuit 102 may be considered to constitute a driving backplane, and the light-emitting device 103 and the encapsulation layer 104 may be considered to constitute a light-emitting structure. The light-filtering layers 121 are arranged corresponding to at least part of the light-emitting devices 103. During implementations, the light-filtering layers 121 each may be arranged for a respective one of the light-emitting devices 103. The light-filtering layer 121 has a hollow segment structure. A section, perpendicular to the driving backplane, of the light-filtering layer 121 is a hollow sectorial shape. As shown in FIG. 2, the thickness of the light-filtering layer 121 in a direction diverging along a sphere center of the hollow segment structure is uniform, so that light paths formed by light emitted by the light-emitting device 103 in the light-filtering layer are the same in length, the color cast problem is eliminated, and a display quality is improved. It should be noted that the driving circuit 102 includes a plurality of thin film transistors configured to drive pixel units.

For example, as for the display substrate with three primary colors RGB as shown in FIG. 2, the light-filtering layers 121 are arranged above the corresponding light-emitting devices 103, that is, a red light-filtering layer 121 is arranged above a red light-emitting device 103, a green light-filtering layer 121 is arranged above a green light-emitting device 103, and a blue light-filtering layer 121 is arranged above a blue light-emitting device 103. FIG. 2 adopts different fill patterns to represent different colors. The light-filtering layers 121 and the light-emitting devices 103 with the same fill pattern are of the same color.

In some embodiments, an orthographic projection of the light-filtering layer 121 on the driving backplane completely covers the corresponding light-emitting device 103, and the light-emitting device 103 is located on the sphere center position of the hollow segment structure of the light-filtering layer 121. It should be noted that in order to express clearly, the display substrate in FIG. 2 magnifies all film layers. A thickness of each film layer is actually a micron order or even nanoscale, and therefore, a thickness from the light-emitting devices 103 to the light-filtering layers 121 is very small. By adjusting the corresponding sizes of the hollow segment structures, all the light-emitting devices 103 may be located at sphere centers of the corresponding hollow segment structures. It is worth noting that in order to effectively filter light rays emitted by the light-emitting device 103, the hollow segment structure of the light-filtering layer 121 is generally not greater than a hemisphere.

Figure 7:
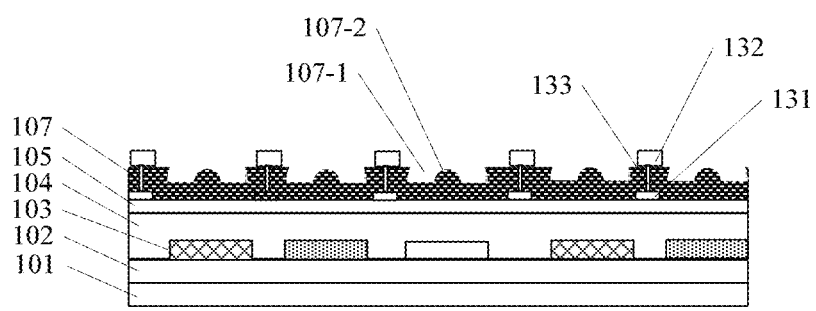

In some embodiments, as shown in FIG. 2 and FIG. 7, in order to manufacture the hollow segment structures of the light-filtering layers 121, corresponding structures need to be manufactured on a surface, in contact with the light-filtering layers 121, of the insulating layer 107. For example, a surface of one side, away from the substrate 101, of the insulating layer 107 includes a plurality of first depressions 107-1 and a plurality of first protrusions 107-2 located in the first depressions 107-1. The light-filtering layers 121 are located in the first depressions 107-1 of the insulating layer. By patterning the surface of the insulating layer 107, the light-filtering layers 121 with the corresponding shapes are conveniently manufactured on the insulating layer.

For example, as shown in FIG. 2, the first protrusion 107-2 may be arranged at the center position of the first depression 107-1. The hollow 121-2 in the hollow segment structure of the light-filtering layer 121 is arranged corresponding to the first protrusion 107-2 of the insulating layer, that is, the first protrusion 107-2 of the insulating layer 107 is filled in the hollow 121-2 in the hollow segment structure of the light-filtering layer 121, and directly contact with the hollow segment structure. The bottom 121-1 in the hollow segment structure of the light-filtering layer 121 is arranged in the first depression 107-1 around the first protrusion 107-2. As shown in FIG. 2, a height h of the first protrusion 107-2 is generally smaller than a depth d of the first depression 107-1, that is, the top of the first protrusion 107-2 does not protrude out of the surface of the insulating layer 107.

Figure 6:
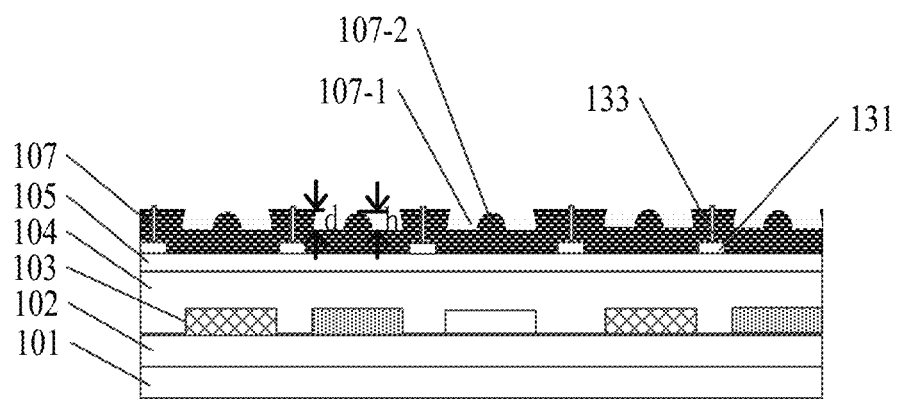
Figure 8:
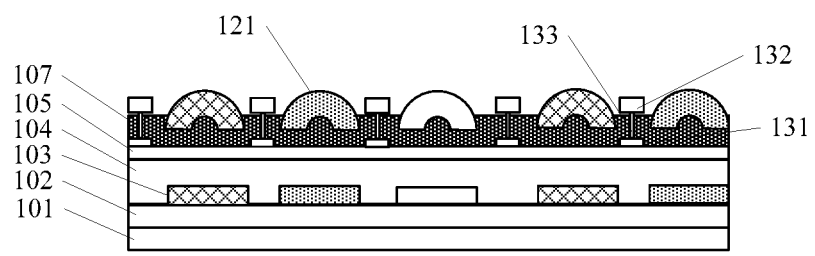

A structure of arranging the first depressions 107-1 and the first protrusions 107-2 on the insulating layer 107 may simply a manufacturing process of the hollow segment structures. As shown in FIG. 6, patterns of the first depressions 107-1 and patterns of the first protrusions 107-2 are formed on the insulating layer 107. As shown in FIG. 8, the desired light-filtering layers 121 with the hollow segment structures are formed through a mask exposure process. In this way, the hollows 121-2 of the light-filtering layers 121 are filled with the first protrusions 107-2, and bottoms of the light-filtering layers 121 are respectively located in the first depressions 107-1 around the first protrusions 107-2. It should be noted that a depth of the first depression 107-1 may be set according to actual application, and may be large or small, which is not limited here.

In some embodiments, as shown in FIG. 2, the light-filtering layer 121 further includes the top 121-3. The top 121-3 of one side of the light-filtering layer 121 away from the substrate 101 is exposed out of an upper surface of the insulating layer 107, and a position of the top 121-3 is higher than the upper surface of the insulating layer 107 in a longitudinal direction and is exposed out of the upper surface of the insulating layer 107. That is, the top 121-3 of one side of the light-filtering layer 121 away from the driving backplane protrudes out a surface of one side of the insulating layer 107 facing away from the driving backplane, so that a thickness of the light-filtering layer 121 is not limited by a thickness of the insulating layer 107.

In some embodiments, because the tops of the light-filtering layers 121 are uneven, a planarization layer 108 needs to be arranged. A surface, in contact with the light-filtering layers 107, of the planarization layer 108 has depressions arranged corresponding to the light-filtering layers. That is, a surface, close to the light-filtering layers 121, of the planarization layer 108 is uneven and the plurality of depressions and protrusions (not shown in the figure) are arranged. The depressions are arranged corresponding to the light-filtering layers 121, and the protrusions are arranged between adjacent light-filtering layers 121.

In some embodiments, the light-filtering structure may further include: a light-shading layer(s) 122. An orthographic projection of the light-shading layer(s) 122 on the driving backplane covers a region(s) between adjacent light-filtering layers 121.

In some embodiments, the display substrate further includes a touch control structure. The touch control structure includes a touch control electrode(s) 132, a bridge electrode(s) 131 and a via hole(s) 133 located in the insulating layer 107. The via hole 133 is configured to enable the touch control electrode 132 to be electrically connected with the bridge electrode 131. The touch control electrode 132 is located between the insulating layer 107 and the planarization layer 108, and the bridge electrode 131 is located between the buffer layer 105 and the insulting layer 107. Orthographic projections of the touch control electrode(s) 132 and the bridge electrode(s) 131 on the driving backplane do not overlap with the light-filtering layer(s) 121, and fall within an orthographic projection of the light-shading layer(s) 122 on the driving backplane.

A capacitive sensing type touch control structure is widely applied due to its advantages of being low in cost, capable of achieving multi-touch, high in response speed and the like. A capacitance change quantity on a position of the touch control electrode is measured through bridge building design, so as to determine a touch position on the display substrate. By comparison, a difference between the touch control structure provided by the embodiments of the present disclosure and the touch control structure in FIG. 1 lies in that a position of the touch control structure provided by the embodiments of the present disclosure shown in FIG. 2 is changed. The touch control electrode 132 in FIG. 1 is arranged on the passivation layer 106, while the touch control electrode 132 in FIG. 2 is arranged on the insulating layer 107. The bridge electrode 131 in FIG. 1 and the bridge electrode 131 in FIG. 2 are both arranged on the buffer layer 105. Through such arrangement, the display substrate structure shown in FIG. 2 removes the passivation layer 106 additionally arranged for arranging the touch control structure, thereby saving a film layer cost and playing a thinning role. Distribution of the touch control electrode 132 and the bridge electrode 131 is not limited, and the touch control electrode 132 and the bridge electrode 131 may be correspondingly arranged according to the application demands.

Figure 10:
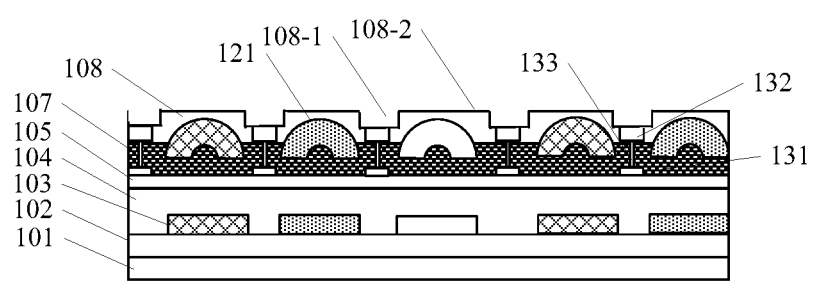

Please refer to FIG. 2 and FIG. 10, in some embodiments, a surface of one side of the planarization layer 108 facing away from the light-filtering layers 121 may include a plurality of second depressions 108-1 and a plurality of second protrusions 108-2 located among the second depressions 108-1. The second depressions 108-1 are located among the light-filtering layers 121, so as to conveniently place the light-shading layers 122. That is, the light-shading layers 122 are located in the second depressions 108-1. Surfaces of sides of the light-shading layers 122 facing away from the light-filtering layers 121 are flush with the surface of one side of the planarization layer 108 facing away from the light-filtering layers 121. Through the above arrangement mode of the light-shading layers 122, the light-shading layers 122 can better absorb external light rays for shading. The light-shading layers 122 in FIG. 1 are arranged in the planarization layer. Compared with a light-shading layer mode in FIG. 2, the planarization layer 108 on the upper portion of the light-shading layers 122 in FIG. 1 will reflect part of the external light rays. Therefore, the display substrate of the present disclosure reduces the reflected light rays of the planarization layer 108, thereby improving the display quality.

The present disclosure further provides a display apparatus, including the display substrate provided by the embodiments of the present disclosure.

The present disclosure further provides a method for preparing a display substrate.

Figure 3:
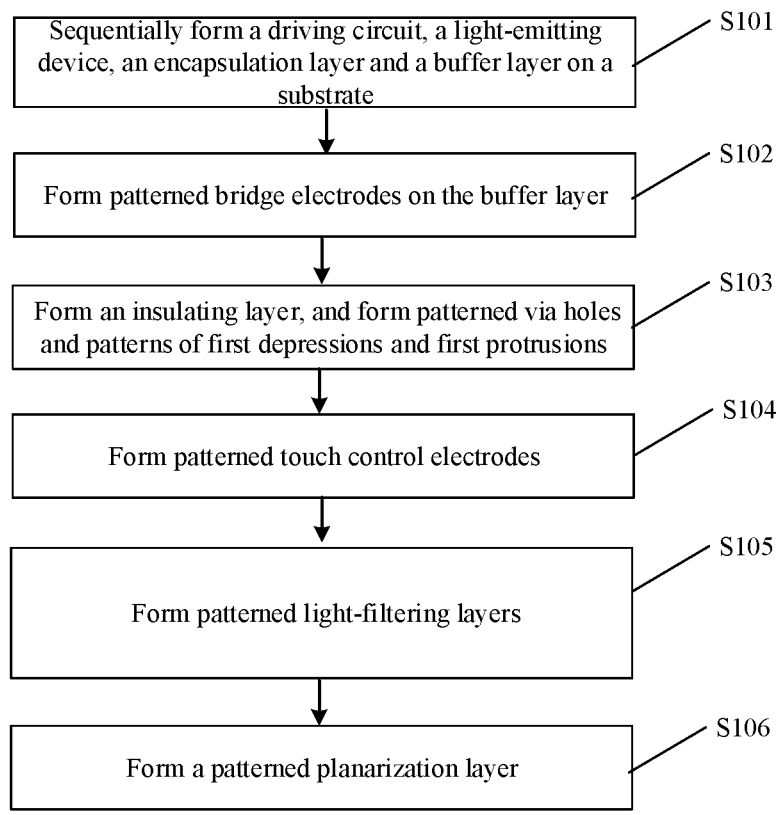
FIG. 3 illustrates an exemplary flow diagram of a method for preparing a display substrate provided by an embodiment of the present disclosure.

Please refer to FIG. 3, the method includes the following operations.

Operation S101: a driving circuit, a light-emitting device, an encapsulation layer and a buffer layer are sequentially formed on a substrate.

Operation S102: patterned bridge electrodes are formed on the buffer layer.

Operation S103: an insulating layer is formed, and patterned via holes and patterns of first depressions and first protrusions are formed.

Operation 104: patterned touch control electrodes are formed.

Operation 105: patterned light-filtering layers are formed.

Operation 106: a patterned planarization layer is formed.

All operations in the above method are illustrated below with reference to FIGS. 4 to 9.

Figure 4:
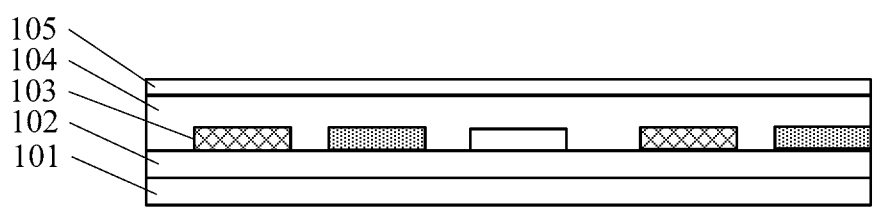
FIG. 4 to FIG. 10 illustrate exemplary schematic structural diagrams after respective operations in the method for preparing the display substrate in FIG. 3 are executed.

In operation S101, as shown in FIG. 4, the driving circuit 102, the light-emitting device 103, the encapsulation layer 104, and the buffer layer 105 arranged in a stacked mode are sequentially formed on the substrate 101.

Figure 5:
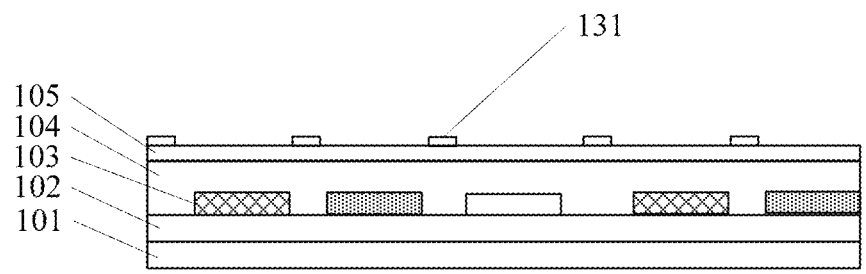

In operation S102, as shown in FIG. 5, the patterned bridge electrodes 131 are formed on the buffer layer 105. The bridge electrodes 131 may be manufactured by adopting a metal material, and a thickness of the bridge electrode is generally between 1500 Angstrom and 3000 Angstrom.

In operation S103, as shown in FIG. 6, the insulating layer 107 is formed on the buffer layer 105, and the via holes 133 and the patterns of the first depressions 107-1 and the first protrusions 107-2 are formed through a mask process. The via holes 133 are configured to enable the bridge electrodes 131 to be connected with the touch control electrodes 132. A thickness of the insulating layer 105 is within 1.2-2.5 micrometers.

In operation S104: as shown in FIG. 7, the patterned touch control electrodes 132 are formed on the insulating layer 107. The touch control electrodes 132 may adopt a metal material, and a thickness of the touch control electrode is generally between 3000 Angstrom and 5000 Angstrom.

In operation S105: as shown in FIG. 8, as for the display substrate with three primary colors, the light-filtering layers 12 with the corresponding colors may be formed through three mask processes, and a thickness of the light-filtering layer 12 is within 1.2-2.5 micrometers.

Figure 9:
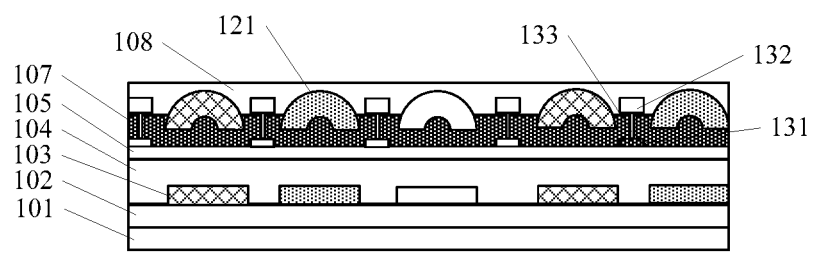

In Operation S106: as shown in FIG. 9, the planarization layer 108 covering the overall display substrate is formed on the light-filtering layers 122. A thickness of the planarization layer 108 is within 1.2-2.5 micrometers.

Please refer to FIG. 10 and FIG. 2, in some embodiments, the method for preparing the display substrate further includes: patterned second depressions 108-1 as shown in FIG. 10 are formed on the planarization layer 108, and light-shading layers 122 as shown in FIG. 2 are formed at the second depressions 108-1. Upper surfaces of the light-shading layers 122 and an upper surface of the planarization layer 108 are arranged on the same plane.

The above description is only preferred embodiments of the present disclosure and explanation to the applied technical principle. Those skilled in the art should understand that the invention scope related in the present disclosure is not limited to the technical solution formed by combination of the above technical features, and meanwhile, should also cover other technical solutions formed by any combination of the above technical features or equivalent features thereof without departing from the concept of the present invention, such as the technical solutions formed by interchange of the above features and the technical features with similar functions in the present disclosure (but not limited to).

What is claimed is:

1. A display substrate, comprising:
a driving backplane;
a light-emitting structure, on the driving backplane, and comprising a plurality of light-emitting devices; and
a light-filtering structure, on a side of the light-emitting structure facing away from the driving backplane;
wherein the light-filtering structure comprises:
a plurality of light-filtering layers corresponding to at least part of the light-emitting devices; and
an insulating layer on sides of the light-filtering layers facing the light-emitting structure;
wherein the light-filtering layers have hollow segment structures; sections of the light-filtering layers perpendicular to the driving backplane are hollow sectorial shapes, and thicknesses of the light-filtering layers in a direction diverging along sphere centers of the hollow segment structures are uniform;
a surface, in contact with the light-filtering layers, of the insulating layer comprises a plurality of first depressions and a plurality of first protrusions in the first depressions; the light-filtering layers are in the first depressions, and a height of the first protrusion is smaller than a depth of the first depression.

2. The display substrate according to claim 1, wherein orthographic projections of the light-filtering layers on the driving backplane completely covers the corresponding light-emitting devices, and the light-emitting devices are on sphere center positions of the hollow segment structures of the light-filtering layers.

3. The display substrate according to claim 1, wherein tops of sides of the light-filtering layers away from the driving backplane protrude out of a surface of a side of the insulating layer facing away from the driving backplane.

4. The display substrate according to claim 3, wherein the light-filtering structure further comprises: a planarization layer on sides of the light-filtering layers facing away from the insulting layer; wherein a surface, in contact with the light-filtering layers, of the planarization layer is provided with cutouts arranged corresponding to the light-filtering layers.

5. The display substrate according to claim 4, wherein the light-filtering structure further comprises: light-shading layers; wherein orthographic projections of the light-shading layers on the driving backplane cover regions among the light-filtering layers.

6. The display substrate according to claim 5, further comprising:
a touch control structure, on a side of the light-emitting structure facing away from the driving backplane;
wherein the touch control structure comprises:
touch control electrodes, and
bridge electrodes,
wherein the touch control electrodes are between the insulating layer and the planarization layer, the bridge electrodes are between the insulating layer and the light-emitting structure, and the bridge electrodes are electrically connected with the touch control electrodes through via holes penetrating through the insulating layer.

7. The display substrate according to claim 6, wherein orthographic projections of the touch control electrodes and the bridge electrodes on the driving backplane do not overlap with the light-filtering layers, and are within orthographic projections of the light-shading layers on the driving backplane.

8. The display substrate according to claim 7, wherein a surface of a side of the planarization layer facing away from the light-filtering layers comprises a plurality of second depressions; and the light-shading layers are in the second depressions, and surfaces of the light-shading layer facing away from the light-filtering layers are flush with a surface of a side of the planarization layer facing away from the light-filtering layers.

9. A display apparatus, comprising the display substrate according to claim 1.

* * * * *